(12) United States Patent
Twomey

(10) Patent No.: US 7,027,791 B2
(45) Date of Patent: Apr. 11, 2006

(54) ANALOG BASEBAND SIGNAL PROCESSING SYSTEM AND METHOD

(75) Inventor: Gerald J. Twomey, Escondido, CA (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 09/968,409

(22) Filed: Sep. 28, 2001

(65) Prior Publication Data

US 2003/0064697 A1 Apr. 3, 2003

(51) Int. Cl.
*H04B 1/10* (2006.01)

(52) U.S. Cl. .................. 455/310; 455/311; 375/316; 375/346

(58) Field of Classification Search .............. 455/310, 455/311, 324, 234.1, 234.2, 241.1, 251.1, 455/296; 375/319, 316, 346; 330/129; 329/318
See application file for complete search history.

(56) References Cited

U.S. PATENT DOCUMENTS

| 5,212,826 | A | 5/1993 | Rabe et al. |
| 5,724,653 | A | 3/1998 | Baker et al. |
| 6,006,079 | A | 12/1999 | Jaffee et al. |
| 6,009,126 | A | 12/1999 | Van Bezooijen |
| 6,031,878 | A | 2/2000 | Tomasz et al. |
| 6,240,100 | B1 * | 5/2001 | Riordan et al. ............. 370/442 |
| 6,498,929 | B1 * | 12/2002 | Tsurumi et al. ............. 455/296 |

OTHER PUBLICATIONS

Muniz, James M. and Maoz, Barak. "Improving the Dynamic Range of Si MMIC Gilbert Cell Mixers for Homodyne Receivers," IEEE Microwave and Millimeter–Wave Monolithic Circuits Symposium, 1994, pp. 103–106.*

J.C. Rudell, J. Ou, R.S. Narayanaswami, G. Chien, J.A. Weldon, L. Lin, K. Tsai, L. Tee, K. Khoo, D. Au, T. Robinson, D. Gerna, M. Otsuka, and P.R. Gray, Recent Developments in High Integration Multi–Standard CMOS Transceivers for Personal Communication Systems, 1998, Invited Paper, International Symposium on Low Power Electronics, Monterey, CA.

* cited by examiner

*Primary Examiner*—Nay Maung
*Assistant Examiner*—Edan Orgad
(74) *Attorney, Agent, or Firm*—Blakely, Sokoloff, Taylor & Zafman LLP

(57) ABSTRACT

In an analog baseband signal processing system and method, gain and offset are measured for each of a plurality of stages. The DC content inherent to the amplifier and filter circuitry is measured by known means. A digital number for each gain and offset level is generated and converted to digital, numerical form of correction of each stage, and converted back to analog form to make the compensation without corrupting near DC signals. In a preferred form, first and second channels of the analog baseband signal processor are provided for in-phase and quadrature channels in a direct conversion, solid-state telephone receiver.

14 Claims, 4 Drawing Sheets

ANALOG BASEBAND SIGNAL PROCESSING SYSTEM AND METHOD

FIELD OF INVENTION

The present invention relates to correcting DC offset errors in a direct conversion receiver while avoiding corruption of the converted signal.

BACKGROUND OF THE INVENTION

In a radio receiver, a received radio signal is converted to provide an analog signal at a baseband frequency. Signal processing components, such as mixers, amplifiers and filters, each introduce their own DC content into the signal path of the analog system. Particularly where the analog signal contains signal content near the DC level and also particularly where conventional high gains are employed, such DC content distorts the signal. The DC content due to the signal processing components is referred to as offset.

Existing solutions for offset removal or reduction exist. Prior methods utilize AC coupling between amplifiers to remove DC content. However, this technique removes low frequency signal content of the data stream. Additionally, the reactances utilized in such systems lead to signal degeneration and slow response of the circuit to changing signal input conditions.

A particularly significant application of the present invention is in a solid state mobile telephone receiver using a single mixer, direct conversion architecture. A prevalent form of this receiver includes first and second baseband signal processing channels for respectively processing in-phase and quadrature components of any solid state receiver and signal processing chip or chips. The invention is applicable to other radio receivers than direct conversion receivers.

SUMMARY OF THE INVENTION

It has been realized in accordance with the present invention that it is desirable to provide DC coupling between each stage. The silicon chip in which the analog signal baseband processing system is embodied is reduced in size due to the elimination of AC coupling. Further, the lack of capacitive reactance between stages avoids signal corruption. Conventional offset compensation circuits have low bandwidth and slow response. It is also highly desirable to provide offset parameters in a fashion in which the offsets are separate from the signal being processed.

Briefly stated, in accordance with the present invention, a multistage direct current amplifier provides a signal path for an analog signal at baseband frequency. The amplifier has a plurality of stages each inherently providing offset while performing signal processing. The stages are DC coupled. A detector receives an output from each stage and measures an amplitude level and an offset level for each stage. A processor receives detector outputs to produce control signals (preferably digital numbers) which are each supplied to a respective amplifier stage to compensate for gain and offset. In a preferred form, there are two filter amplifier channels each corresponding to one channel as used in all quadrature receiver systems.

BRIEF DESCRIPTION OF THE DRAWINGS

The method means by which the foregoing features of the invention are achieved are pointed out with particularity in the claims forming the concluding portion of the specification. The invention, both as to its organization and manner of operation, may be further understood by reference to the following description taken in connection the following drawings.

Of the drawings.

DETAILED DESCRIPTION OF THE PREFERRED EMBODIMENT

Figure 1:
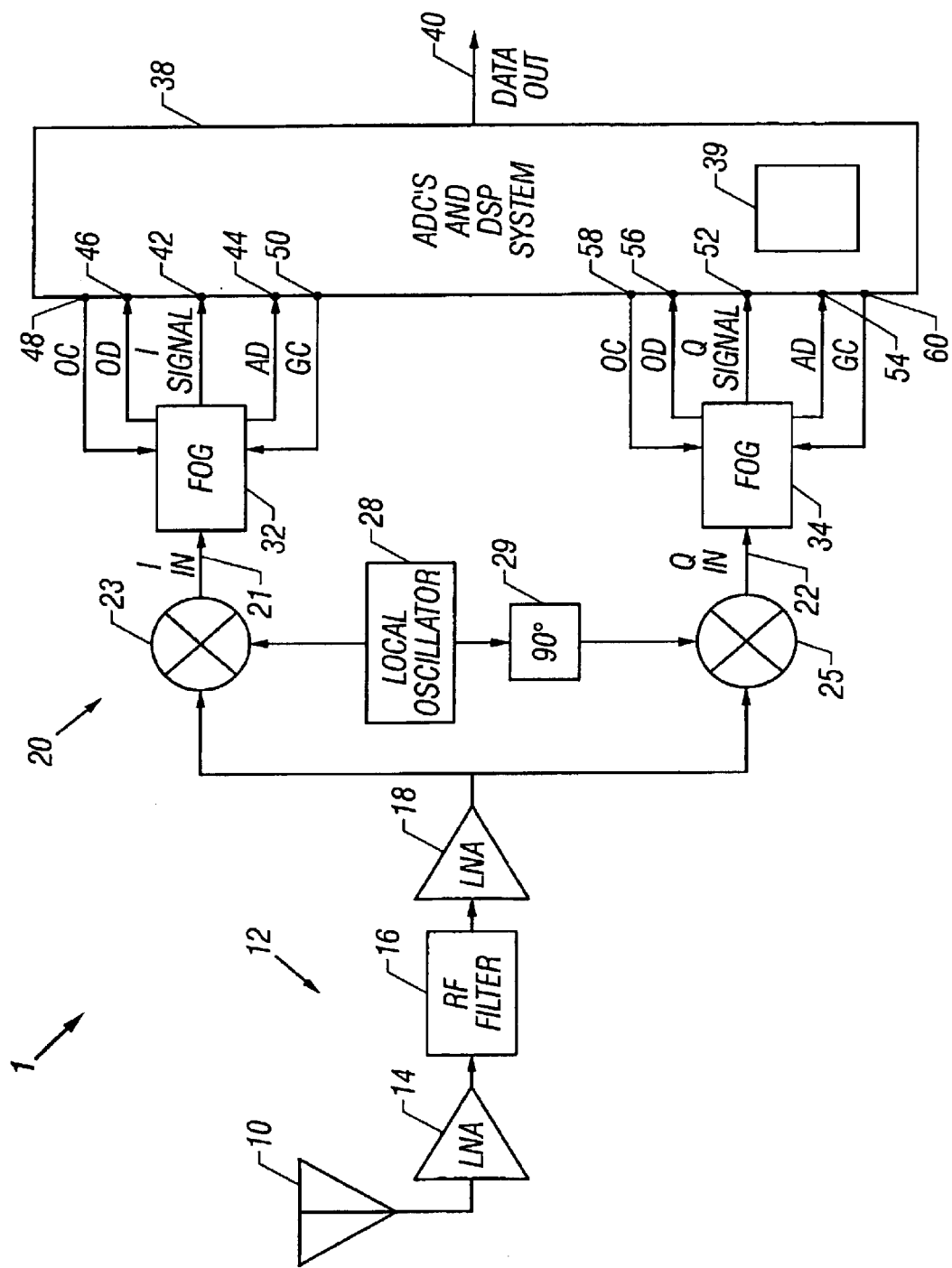
FIG. 1 is a block diagrammatic illustration of a direct conversion receiver incorporating the invention.

FIG. 1 is a block diagrammatic representation of a direct conversion receiver 1 incorporating the present invention. The direct conversion receiver finds wide application in radio telephone use. However, the present invention may be used in a wide variety of contexts. In a conventional manner, the receiver 1 receives signals from an antenna 10 which are provided via a filtering stage 12. In the present embodiment, the filtering stage 12 comprises a first low-noise amplifier 14, a radio frequency filter 16 and a second low-noise amplifier 18 connected in series between the antenna 10 and a mixer stage 20.

In the present embodiment, the mixer stage or Gilbert cell detector, 20 comprises an in-phase channel 21 and a quadrature channel 22, and includes an in-phase mixer 23 and a quadrature channel mixer 25. The inputs to the mixers 23 and 25 are mixed with a frequency signal from a local oscillator 28. A phase shifter 29 connected between the local oscillator 28 and the mixer 25 provides for quadrature phase shift of the mixing signal. In this manner, input signals at the operating frequency of the receiver 1 are provided at the outputs of the in phase channel and quadrature channel mixers 23 and 25. Typically, it is preferred that signal paths are differential, rather than comprising single inputs as illustrated in FIG. 1. However, for simplicity in the drawing, and since means for providing differential signal paths are extremely well-known, the particular wiring configuration need not be shown. Consequently, the Figures may be viewed as representing both full differential and non-differential signal paths.

Mixers 23 and 25 provide inputs to FOG stages 32 and 34 respectively. FOG here stands for filters, offset and gain units. There are many designs that are well-known in the art for providing filtering and gain. It is well-known to provide different numbers of discrete filters and vary the sequence in series connection of filters and amplifiers. Filtering may be provided in one or more stages. Controls may be distributed over a plurality of stage or included in a single stage filtering, and gain control functions may be combined in some stages and not in others. Each of these arrangements is well-known in the art. The FOG stages 32 and 34 are illustrative of each of these options. The FOG stages 32 and 34 each further comprise offset means. Offset means include means for measuring offset and further means for providing an offset compensation signal to the FOG stages 32 and 34 (further described below). The FOG stages 32 and 34 each provide an output signal to a digital signal processing system (DSP) 38. The DSP system 38 provides an output which may comprise voice and data, at an output terminal 40. The digital signal processing system 38 may take many well-known forms. The operations performed on a signal described below comprise instructions to arrange the building blocks of the DSP system 38.

The FOG stage 32 provides an in phase signal output to the DSP stage 38 at a terminal 42. The FOG stage 32 also includes a known amplitude detector providing an amplitude detection signal to terminal 44 at the DSP system 38. The FOG stage 32 and offset detection signal provide an offset detection signal to a terminal 46. The FOG stage 32 receives an offset compensation signal from a terminal 48 of the DSP system 38 and receives a gain control from a terminal 50. Similarly, the FOG stage 34 provides a quadrature phase output signal to a terminal 52, an amplitude detection signal to a terminal 54 and an offset detection signal to a terminal 56 to the DSP system 38. The DSP system 38 provides an offset control signal and a gain control signal to the FOG stage 34 from terminals 58 and 60 respectively.

Figure 2:
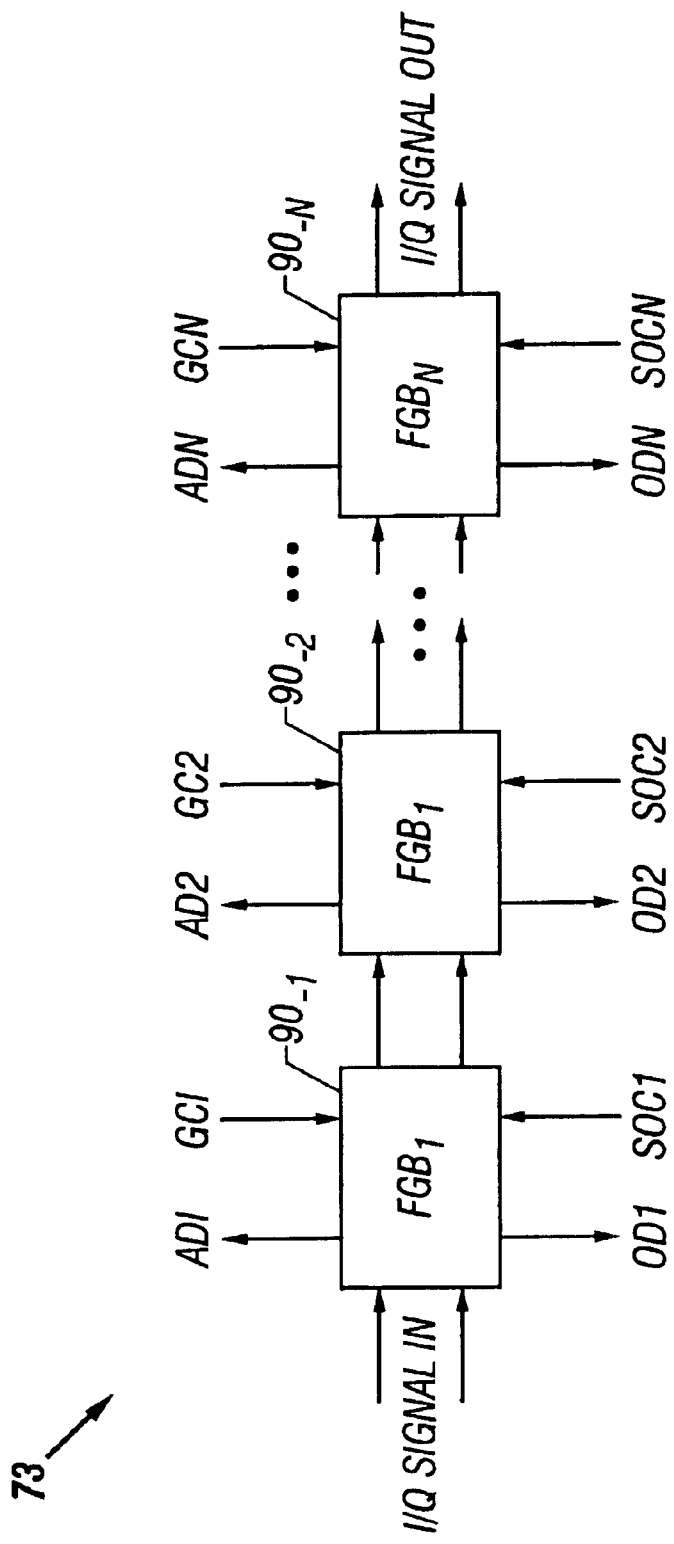
FIG. 2 is an illustration in further detail of the filter/gain block intermediate the mixer and digital signal processing system of FIG. 1.

FIG. 2 is a block diagram of a typical form of the filter/gain block 73. In FIG. 2, differential inputs are illustrated. The general case is illustrated for any number of desired stages. Consequently filter/gain block stages are labeled $FGB_1$, $FGB_2$ . . . $FGB_n$ having corresponding reference numerals 91-01, 90-2 . . . 90-*n*. The number of stages required is a function of design requirements for the signal channel in which the filter/gain block 73 is included. Each stage produces an amplitude detection signal and an offset detection signal. Each stage, or selected stages receive a gain control signal and a static offset control signal input. The amount of filtering needed in a particular application could be a function of the required signal to noise ratio, expected interfering signals or of other parameters.

For adjusting gain of the filter gain block 73, gain control terminal 50 is connected to the filter gain block 73. The offset control terminal 48 of the DSP system 38 is coupled to a static offset control circuit 83 providing an output to the summer 70 and also provides input to the dynamic offset control circuit 81. The static offset control function is preferably performed in the digital domain. Therefore, the terminal 48 may provide a digital output, and the static offset control circuit 83 will then include a digital to analog converter to provide an analog signal to the summer 70. Terminal 48 also represents a terminal for providing analog inputs to the dynamic offset control circuit 81. A first analog input comprises a "centering" input for establishing a reliable zero level for the summer 70 and also includes dynamic offset rate control to assure that a proper time window is established for adding of the signals received at the summer 70.

Figure 3:
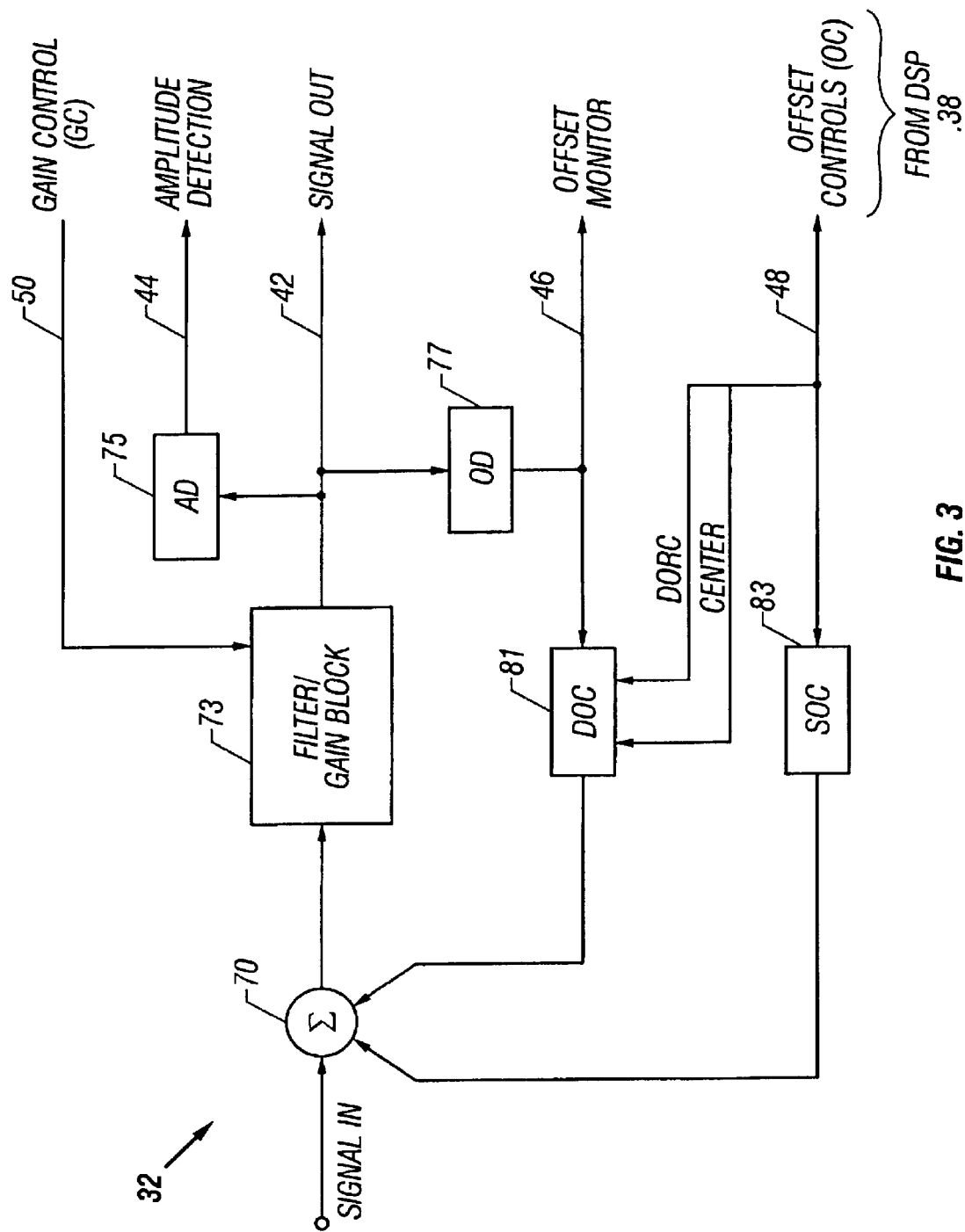
FIG. 3 is a detailed illustration of the filter, offset and gain sections of the embodiment of FIGS. 1 and 2.

FIG. 3 is a more detailed block diagrammatic illustration of a FOG stage 32 or 34. For convenience in the description, reference numerals from the in-phase channel 21 are utilized. The output from the mixer 23 is received by a summer 70. The summer 70 also receives offset corrections as further described below. The output of the summer 70 is received at a filter/gain block 73. The filter/gain block 73 may take any of a number of well-known constructions as further described with respect to FIG. 3. The filter/gain block 73 is the component of the FOG stage 32 that receives the gain control signal from the DSP system 38 and provides a stage or stages of filtering for the in-phase channel 21 signal. The filter/gain block 73 delivers the in-phase output signal to the terminal 42. An amplifier detector 75 also connected to the filter/gain block 73 provides the amplitude detection signal to the terminal 44. An offset detector 77 is also connected to the output of the filter gain block 73. The output of the offset detector 77 is provided to the terminal 46 and also to a dynamic offset control circuit 81.

At a minimum, the digital signal processes system 38 keeps track of the following functions. Each filter/gain block stage 90 contains an offset detector. Offset generation is inherent in receiver components. Each stage provides an output indicative of offset. Further, the digital signal processor 38 tracks the amplitudes measured at each stage. Therefore, the DSP circuit can generate offset control signals required for each stage 90. Further, the digital signal processor 38 tracks amplitudes. Gain control signals are generated to keep signals within an operating range and to provide for rationalized and control in feedback control of the system. Gain changes in the forward path, i.e., to the DSP system 38 call for changes in the feedback loop to the FOG units 32 and 34. By providing for this change, the system can adjust quickly. In other words, the offset control changes can be provided in real time with respect to the system operating clock so that optimal operation is provided at all times.

Due to the interactivity of the analog circuitry with the DSP 38, the present system has the capability to interactively determine proper status offset settings, and store the appropriate control settings. In the preferred form, for a particular gain, a suitable static offset setting is held as stored data. The DSP 38 includes a memory 39 for storing data. This allows rapid changes in gain settings, supported by concurrent changes in pre-determined offset values.

The DSP 38 embodies a control algorithm which supports two modes: calibration and application. Calibration mode is in the process of interactively determining the static offset setting, for a given gain setting. Dynamic offset control is set to "center" during calibration. The application mode is the use of the gain and offset settings in the application. Changing the gain and offset settings, and applying the "center" control immediately sets the appropriate offset for that configuration. Dynamic offset control is for incremental adjustments after the static offset control has been set.

The DSP 38 may also be viewed as a machine-readable medium. A machine-readable medium includes any mechanism that provides (i.e. stores and/or transmits) information in a form readable by a machine (e.g. computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.).

Figure 5:
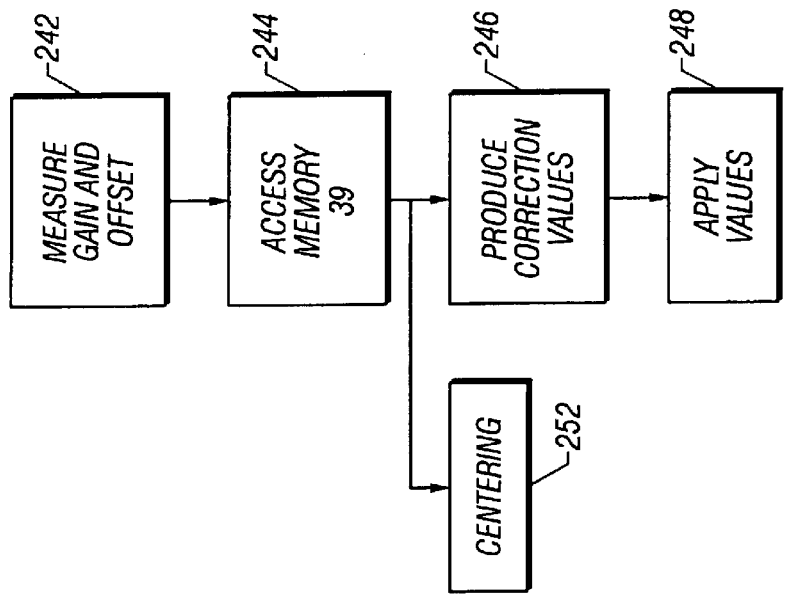
FIG. 5 is a flow chart representing the operations of correction of offset and gain value.
Figure 4:
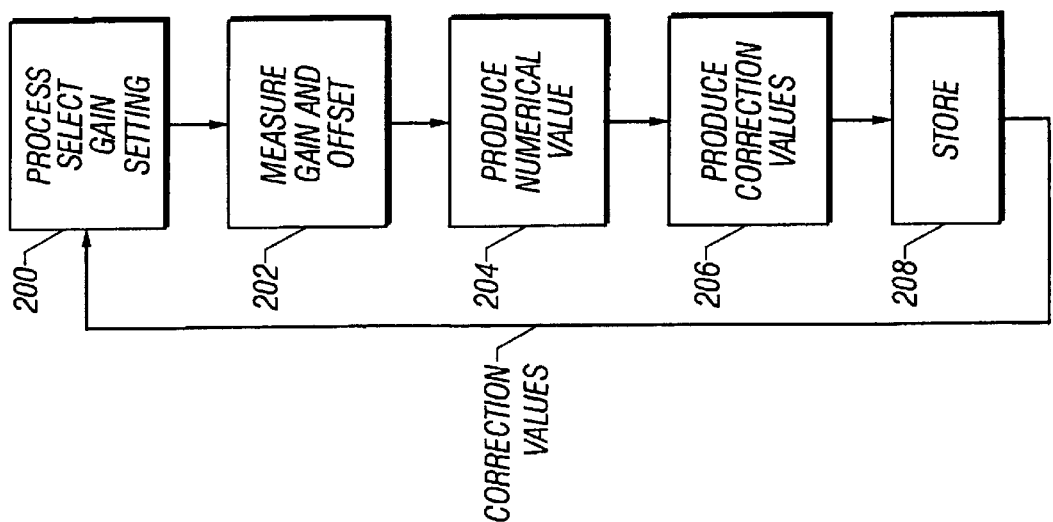
FIG. 4 is a flow chart representing the method of correction of offset and gain values.

FIG. 4 is a flow chart representing the calibration method of the apparatus of FIG. 1; and FIG. 5 represents the operating method. As seen in FIG. 4 at block 200 a DC coupled multistage analog baseband signal processing calibration method begins. At block 202, offset and gain for each stage 90 is measured. These values are obtained for an overall gain setting of the filter offset and gain units 32 and 34. Next, each offset and gain is converted to a numerical value as seen at block 204. At block 206, the numerical values are processed to produce a correction value for offset and for gain for each stage 90. In block 208, the numerical values are stored in digital form so they can be readily accessed when the receiver 1 is in operation. Once storage is completed for a particular gain setting, operation returns to block 200, and the process is repeated until all compensation settings are stored in the memory 39 of the DSP system 38. The DSP system 38 includes a memory 39 for storing generated compensation values in one mode of operation. When the values are stored, the DSP system may access correction values for particular stages in the FOG units 32 and 34 based on the overall gain to be produced.

FIG. 5 represents operation. In operation, at block 242, offset and gain are measured. The memory 39 is accessed at block 244 based on the measurements at block 242. Digital correction values are produced at block 246. At block 248, digital to analog conversion is performed and the correction signals are applied to the appropriate inputs of each stage. Additionally, while the analog values are being generated, in parallel, at block 252, a centering value is provided to the digital offset control unit 81 the analog input will be supplied on the DORC input.

As will be seen from the foregoing specification, many different schemes can be provided in accordance with the present invention to provide for a fast, accurate system for correcting levels in a multistage, DC coupled amplifier. Compensation is provided for each amplifier stage's inherently provided direct current contribution to the signal path. This compensation is done without correcting the signal. Many future equivalent arrangements will be apparent to those skilled in the art.

What is claimed is:

1. An analog baseband signal processing system comprising:
   a plurality of stages defining an analog signal path between a signal input and a digital signal processor, each stage being DC coupled in series to the next stage and being capable of providing an offset to the signal path;
   an offset detector for each stage tracking offsets at each stage and providing an output indicative of the offset to said digital signal processor;
   means for receiving an offset control signal from said digital signal processor for each stage in analog form for addition to said signal path in each said stage for correcting offset in response to the offset for that stage.

2. The system of claim 1 wherein each stage further comprises an amplifier detector providing an amplitude to the digital signal processor indicative of gain of said stage and an input for receiving a gain control signal from said digital signal processor.

3. The system according to claim 2 further comprising the digital signal processor, said digital signal processor being programmed to perform a static offset calculation in the digital domain based on said output indicative of offset from a stage and wherein said stage comprises a static offset control circuit to provide an analog input to said stage.

4. The system according to claim 3 further comprising a dynamic offset control circuit, said dynamic offset control circuit receiving inputs from said digital signal processor or one said input comprising a centering input for establishing a reliable zero level for the stage and a second input including a dynamic offset rate control establishing a time window for addition of signal input to said stage.

5. The system according to claim 4 wherein said analog baseband signal processing system is a direct conversion radio receiver including inphase and quadrature mixers, each mixer providing an input to a respective one of a pair of analog signal paths.

6. An analog baseband processing system comprising:
   an input filtering stage;
   a Gilbert cell detector receiving an input from said filtering stage and providing in-phase and quadrature outputs to first and second serial paths respectively;
   a digital signal processor receiving inputs from each serial signal path and providing data out at an output terminal;
   each serial signal path comprising a filter offset gain unit comprising at least one filter gain block stage providing an output to a next circuit, said next circuit being a next filter gain block or a digital signal processor; and
   each stage comprising an offset detector for tracking DC amplitude in said stage and providing a signal to said digital signal processor and for receiving from said digital signal processor an offset correction signal.

7. The analog baseband processing system according to claim 6 wherein each stage further comprises an amplifier detector providing an amplitude to the digital signal processor indicative of gain of said stage and an input for receiving a gain control signal from said digital signal processor.

8. A method for correcting for offset in a multistage analog processing signal path, each stage being DC coupled in series to a next stage and capable of contributing to offset in said signal path, the method comprising detecting an offset signal for each stage comprising a DC amplitude variable with time and providing said offset signals to a digital signal processor, computing in the digital signal processor an offset correction signal for each stage and adding to said signal path in each stage a DC level in accordance with said correction signal.

9. The method of claim 8 further comprising detecting an amplitude output from a stage, providing said output for processing to determine gain and providing a gain correction signal to said stage.

10. The method of claim 9 further comprising calculating a dynamic offset signal in said digital signal processor and providing to said stage a dynamic offset rate control signal establishing a time window for addition of the offset correction signal input to said stage.

11. An analog baseband signal processing system comprising:
    a plurality of stages defining an analog signal path between a signal input and a digital signal processor, each stage being DC coupled to the next stage and being capable of providing an offset to the signal path;
    an offset detector for each stage tracking offsets at each stage and providing an output indicative of the offset to said digital signal processor,
    means for receiving an offset control signal from said digital signal processor in analog form for addition to said signal path in said stage for correcting offset in response to the offset for that stage;
    each stage further comprising an amplifier detector providing an amplitude to the digital signal processor indicative of gain of said stage and an input for receiving a gain control signal from said digital signal processor;
    said digital signal processor being programmed to perform a static offset calculation in the digital domain based on said output indicative of offset from a stage and wherein said stage comprises a static offset control circuit to provide an analog input to said stage; and
    a dynamic offset control circuit, said dynamic offset control circuit receiving inputs from said digital signal processor or one said input comprising a centering input for establishing a reliable zero level for the stage and a second input including a dynamic offset rate control establishing a time window for addition of signal input to said stage.

12. The system according to claim 11 wherein said analog baseband signal processing system is a direct conversion radio receiver including inphase and quadrature mixers, each mixer providing an input to a respective one of a pair of analog signal paths.

13. A method for correcting for offset in a multistage series connected DC coupled analog processing signal path, each stage being capable of contributing to offset in said signal path, the method comprising detecting an offset signal for each stage comprising a DC amplitude variable with time and providing said offset signals to a digital signal processor, computing in the digital signal processor an offset correction signal for each stage and adding to said signal path in each stage a DC level in accordance with said correction signal, detecting an amplitude output from a stage, providing said output for processing to determine gain and providing a gain correction signal to said stage, and calculating a dynamic offset signal in said digital signal processor and providing to said stage a dynamic offset rate control signal establishing a time window for addition of the offset correction signal input to said stage.

14. A method for correcting for offset in a multistage series connected DC coupled analog processing signal path, each stage being capable of contributing to offset in said signal path, the method comprising detecting an offset signal for each stage comprising a DC amplitude variable with time and providing said offset signals to a digital signal processor, computing in the digital signal processor an offset correction signal for each stage and adding to said signal path in each stage a DC level in accordance with said correction signal, the method further comprising the step of detecting an amplitude output from a stage, providing said output for processing to determine gain and providing a gain correction signal to said stage, and further comprising calculating a dynamic offset signal in said digital signal processor and providing to said stage a dynamic offset rate control signal establishing a time window for addition of the offset correction signal input to said stage.

* * * * *